United States Patent
Carnahan (10) Patent No.: US 7,751,171 B2
(45) Date of Patent: Jul. 6, 2010

(54) NANOSCALE GRASPING DEVICE, METHOD FOR FABRICATING THE SAME, AND METHOD FOR OPERATING THE SAME

(75) Inventor: David L. Carnahan, Needham, MA (US)

(73) Assignee: NanoLab, Inc., Newton, MA (US)

( * ) Notice: Subject to any disclaimer, the term of this patent is extended or adjusted under 35 U.S.C. 154(b) by 1093 days.

(21) Appl. No.: 11/224,684

(22) Filed: Sep. 12, 2005

(65) Prior Publication Data

US 2009/0009924 A1   Jan. 8, 2009

Related U.S. Application Data

(63) Continuation of application No. 10/057,262, filed on Jan. 25, 2002, now Pat. No. 6,950,296.

(51) Int. Cl.
  *H01T 23/00* (2006.01)
(52) U.S. Cl. .................................... 361/233
(58) Field of Classification Search ............. 361/233
  See application file for complete search history.

(56) References Cited

U.S. PATENT DOCUMENTS

| | | | |
|---|---|---|---|
| 5,242,541 A | 9/1993 | Bayer et al. | |
| 5,822,170 A | 10/1998 | Cabuz et al. | |
| 5,824,470 A | 10/1998 | Baldeschwieler et al. | |
| 6,144,545 A | 11/2000 | Lee et al. | |
| 6,295,194 B1 | 9/2001 | Sun et al. | |
| 6,307,452 B1 | 10/2001 | Sun | |
| 6,329,738 B1 | 12/2001 | Hung et al. | |
| 6,669,256 B2 * | 12/2003 | Nakayama et al. | 294/99.1 |
| 6,743,408 B2 * | 6/2004 | Lieber et al. | 423/447.1 |
| 6,950,296 B2 * | 9/2005 | Carnahan | 361/233 |
| 7,261,351 B1 * | 8/2007 | Lee | 294/81.21 |

OTHER PUBLICATIONS

Kim et al., Nanotube Nanotweezers, Science, Dec. 10, 1999, p. 2148, vol. 286, issue 5447.
Dai et al., Nanotubes as Nanoprobes in Scanning Probe Microscopy, Nature, Nov. 14, 1996, pp. 147-150, vol. 384.
Sinnott et al., Mechanical Properties of Nanotubule Fibers and Composites Determined From Theoretical Calculations and Simulations, Carbon, 1998, pp. 1-9, vol. 36, Nos. 1-2.
Krishnan et al., Young's Modulus of Single-Walled Nanotubes, Physical Review B, Nov. 15, 1998, pp. 14013-14019, vol. 58, No. 20.
Li et al, Highly-Ordered Carbon Nanotube Arrays for Electronics Applications, Applied Physics Letters, Jul. 19, 1999, pp. 367-369, vol. 75, No. 3.
Thess et al., Crystalline Ropes of Matelic Carbon Nanotubes, Science, Jul. 26, 1996, pp. 483-487, vol. 273.
Yudasaka et al., Specific Conditions for Ni Catalyzed Nanotube Growth by Chemical Vapor Deposition, Applied Physics Letters, Oct. 23, 1995, pp. 2477-2479, vol. 67, No. 17.
Ren et al., Synthesis of Large Arrays of Well-Aligned Carbon Nanotubes on Glass, Science, Nov. 6, 1998, vol. 282.

(Continued)

*Primary Examiner*—Stephen W Jackson
(74) *Attorney, Agent, or Firm*—Pandiscio & Pandiscio (57) ABSTRACT

A nanoscale grasping device comprising at least three electrostatically actuated grasping elements, wherein the nanoscale grasping device may be used to more accurately grasp an object, more easily hold an object in a defined location or orientation and more readily manipulate an object.

26 Claims, 6 Drawing Sheets

OTHER PUBLICATIONS

Huang et al., Growth of Highly Oriented Carbon Nanotubes by Plasma-Enhanced Hot Filament Chemical Vapor Deposition, Applied Physics Letters, Dec. 28, 1998, pp. 3845-3847, vol. 73, No. 26.

Ren et al., Growth of a Single Freestanding Multiwall Carbon Nanotube on Each Nanonickel Dot, Applied Physics Letters, Aug. 23, 1999, pp. 1086-1088, vol. 75, No. 8.

* cited by examiner

FIG. 6

NANOSCALE GRASPING DEVICE, METHOD FOR FABRICATING THE SAME, AND METHOD FOR OPERATING THE SAME

REFERENCE TO PENDING PRIOR PATENT APPLICATION

This application is a continuation of prior U.S. patent application Ser. No. 10/057,262, filed Jan. 25, 2002 now U.S. Pat. No. 6,950,296 by David L. Carnahan for NANOSCALE GRASPING DEVICE, METHOD FOR FABRICATING THE SAME, AND METHOD FOR OPERATING THE SAME.

The above-identified patent application is hereby incorporated herein by reference.

STATEMENT REGARDING FEDERALLY SPONSORED RESEARCH OR DEVELOPMENT

This invention was made with Government support under contract DAAD17-01-C0025 awarded by U.S. Army Robert Morris Acquisition Center RMAC-Adelphi. The Government has certain rights in the invention.

FIELD OF THE INVENTION

This invention relates to nanoscale devices in general, and more particularly to a nanoscale grasping device particularly suited for the grasping and manipulation of nanoscale objects, and to the fabrication and operation of the same.

BACKGROUND OF THE INVENTION

The techniques of atomic force microscopy ("AFM") and scanning tunneling microscopy ("STM") are used to create three-dimensional topographic maps of a surface, providing a level of detail that approaches, the case of STM, atomic resolution. These methods generally rely upon the use of a sharp tip to sense the topography of a surface, including the position of particles and objects on that surface, with tunneling current or force data being used to provide the topographic information. These tips are often etched from silicon. See, for example, U.S. Pat. No. 5,242,541, issued Sep. 7, 1993 to Bayer et al. for METHOD OF PRODUCING ULTRAFINE SILICON TIPS FOR THE AFM/STM PROFILOMETRY.

It has also been recognized that nanofibers, such as carbon nanotubes, can make excellent tips for these imaging techniques. See, for example, Dai et al., "NANOTUBES AS NANOPROBES IN SCANNING PROBE MICROSCOPY", Nature, Vol. 384, 14 Nov. 1° 96, Pages 147-150. One reason for the interest in forming sensing tips out of carbon nanotubes is the high stiffness and aspect ratio common to carbon nanotubes. By way of example, the elastic moduli for carbon nanotubes are similar to those for diamond, as calculated and measured by various researchers, including Sinnott et al., "MECHANICAL PROPERTIES OF NANOTUBE FIBERS AND COMPOSITES DETERMINED FOM THEORETICAL CALCULATIONS AND SIMULATIONS", Carbon, Vol. 36, Nos. 1-2, Pages 1-9, 1998; and Krishnan et al., "YOUNG'S MODULUS OF SINGLE-WALLED NANOTUBES", Physical Review B, Vol. 58, No. 20, 15 Nov. 1998, Pages 14013-14019. Furthermore, in U.S. Pat. No. 5,824,470, issued Oct. 20, 1998 to Baldeschwieler et al. for METHOD OF PREPARING PROBES FOR SENSING AND MANIPULATING MICROSCOPIC ENVIRONMENTS AND STRUCTURES, there is taught the chemical modification of a silicon AFM tip to prepare a functionalized tip, which can include a nanotube.

The aforementioned sensing tips are primarily designed to function as interrogation tools, and are generally poorly suited to physically manipulate objects. With the aforementioned sensing tips, object manipulation is generally limited to either pressing an object against a surface or pushing the object across a surface. The aforementioned sensing tips generally lack the ability to pick up, translate or deposit an object elsewhere. If these tips could perform such grasping, translating and deposition functions, a large variety of different patterns, structures, circuits and devices could be assembled with microscale, nanoscale or near atomic resolution.

To perform these more sophisticated manipulation functions, a grasping tool is generally required. In this respect a two element, tweezer-type grasping tool is described in Kim et al., "NANOTUBE NANOTWEEZERS", Science, Dec. 10, 1999, v286, i5447, p2198. More particularly, Kim et al. teach the construction of a two element tweezer using two nanotubes. One end of each nanotube is adhesively bonded to an electroded micropipette, with the other end of each nanotube remaining free. A pre-determined DC voltage differential selectively applied to the two elements causes electrostatic attraction of the two free tips, thereby causing them to close down on an object.

However, the two element tweezer of Kim et al. can be somewhat unstable and difficult to control, can be relatively difficult to construct, and provides minimal operating control.

More particularly, the two elements of the Kim et al. tweezer together define only a line contact, which is inherently unstable and difficult to control, particularly in a nanoscale device.

In addition, the Kim et al. tweezer is constructed by selectively adhering individual nanotubes to electroded micropipettes. This is, at best, a difficult and inexact procedure, and makes tweezer fabrication problematic inasmuch as alignment, nanotube length and the point of attachment cannot be directly controlled.

Furthermore, Kim et al. used a simple, pre-determined DC voltage to create the attractive and repulsive forces used to close and open the tweezers. This provides minimal operating control.

SUMMARY OF THE INVENTION

As a result, one object of the present invention is to provide an improved nanoscale grasping device which is relatively stable and easy to control.

Another object of the present invention is to provide an improved nanoscale grasping device which is relatively easy to construct.

And another object of the present invention is to provide an improved nanoscale grasping device which has increased operating control.

Still another object of the present invention is to provide an improved nanoscale grasping device which has an improved method of operation.

These and other objects of the present invention are addressed by the provision and use of a novel nanoscale grasping device comprising at least three electrostatically actuated grasping elements. In accordance with the present invention, it has been discovered that the use of at least three elements, which together define a plane, allows an object to be grasped more accurately, more easily held in a defined location or orientation, and more readily manipulated.

In one preferred form of the invention, the grasping elements comprise conductive nanotubes which are grown at specific points on a substrate (e.g., directly on an electrode), using chemical vapor deposition ("CVD") techniques, thereby allowing the grasping device to be manufactured with greater control.

And in one preferred form of the invention, different types of electrostatic forces may be used to open or close the grasping tool. More particularly, in accordance with the present invention, such attractive and repulsive forces can be created through the application of either a constant voltage or an oscillating voltage.

Furthermore, it has been discovered that by changing the phase of the oscillating voltage on each grasping element, the attractive and repulsive forces between multiple grasping elements can be controlled so as to cause the opening or closing of the grasping elements.

Additionally, in accordance with the present invention, it has been discovered that the magnitude of the DC or oscillating voltage can be adjusted so as to alter the attractive forces created between the grasping elements.

And in the case of the oscillating voltage, the frequency or speed at which the phases transform can be altered so as to adjust the gripping action between the various grasping elements. Additionally, the frequency or speed at which the phases transform can be altered so as to cancel or enhance resonant thermal or mechanical vibration of the nanotubes.

BRIEF DESCRIPTION OF THE DRAWINGS

The accompanying drawings, which are incorporated in and constitute part of the specification, schematically illustrate preferred embodiments of the invention and, together with the general description given above and the detailed description of the preferred embodiments given below, serve to explain the principles of the invention.

FIG. 3A is a schematic representation of a three phase alternating voltage that is applied to each of the three grasping elements, 10, 15 and 20, respectively, producing a time averaged net attraction and corresponding closure of the elements about the center. V1 represents the voltage on grasping element 10, and is represented by a solid line. V2, the voltage on grasping element 15, is represented by a short dashed line. V3, the voltage on grasping element 20, is represented by a long dashed line.

FIG. 3B is a schematic representation of the three grasping elements at one point in the voltage cycle, where the grasping element 10 is at its maximum positive voltage V1. The grasping element 15 and grasping element 20 are both at negative potentials, V2 and V3 respectively, and are equal, although not at their maximum negative potential. An electrostatic attractive force exists between grasping elements 10 and 15, and between grasping elements 10 and 20, but the interaction between the grasping elements 15 and 20 is repulsive.

FIG. 3C is a schematic representation of the three grasping elements at another point in the voltage cycle, where the voltage V1 on grasping element 10 is positive but reduced from its maximum positive voltage. Grasping element 15 at this point has a zero voltage V2. Grasping element 20 is approaching its maximum negative voltage V3. A strong attractive force exists between grasping elements 10 and 20. Depending on the amount of polarization (charge separation) at the tip of grasping element 15, there will be some attractive force between all three of the elements.

FIG. 3D is a schematic representation of the three grasping elements at a later point in the voltage cycle, where the voltage V1 on grasping element 10 is equivalent to the voltage V2 on grasping element 15, and grasping element 20 has acquired its full negative potential V3. The situation is symmetric and similar to the condition shown in FIG. 3B, although the signs are reversed. An attractive force exists between grasping elements 15 and 20, and also between grasping elements 15 and 20, but a repulsive force is established between grasping elements 10 and 15.

DETAILED DESCRIPTION OF THE PREFERRED EMBODIMENTS

The present invention is directed to a nanoscale grasping device, a method of fabricating the same, and operation of the same.

In one preferred form of the present invention, a substrate is patterned with a number of electrodes, and a catalyst particle is deposited atop each electrode. A nanotube is then grown from each catalyst particle, resulting in a nanotube attached at one end to a substrate electrode. The application of a voltage on the electrodes creates electrostatic attractive and repulsive forces between the tips of adjacent nanotubes, resulting in a grasping action between the nanotubes.

Figure 1:
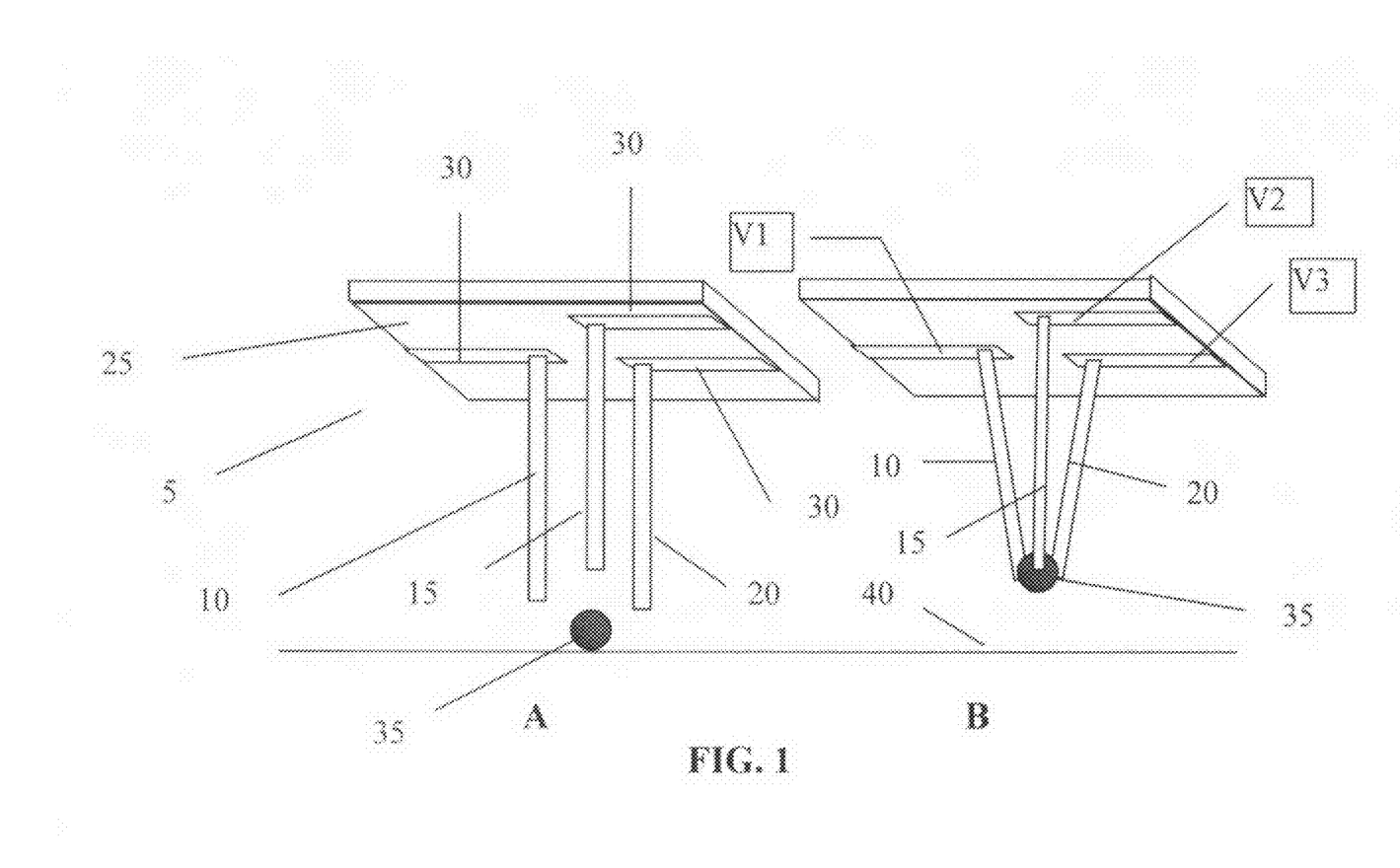
FIG. 1A is a schematic representation of a three element nanoscale grasping device, fabricated on a substrate with electrodes for voltage application. An object which is to be grasped sits below on a surface.
FIG. 1B is a schematic representation of the same nanoscale grasping device holding an object after a voltage has been applied to the grasping elements, causing them to close around the object.

Referring first to FIG. 1A, there is shown a three element nanoscale grasping device 5 comprising three grasping elements 10, 15 and 20 fabricated on a substrate 25. Substrate 25 may be an insulator such as glass, quartz, alumina and the like, or a semiconductor such as silicon or germanium and the like. Any substrate that can support deposition of electrodes 30 and grasping elements 10, 15 and 20 will suffice. Substrate 25 may stand alone or be mounted to another structure (not shown) comprising circuits and/or electrical components.

Electrodes 30 can be produced lithographically, patterned using photoresists and masks, or by other techniques such as electron beam lithography, dip pen lithography, lithographically induced self assembly ("LISA"), and self assembled monolayers to mask off specific areas. Once patterned, electrodes 30 can be deposited on the unmasked areas. Electrodes 30 are commonly produced from conductive metals such as gold, silver, copper, chromium, aluminum, titanium, nickel, and their alloys, or from conductive oxides such as indium tin oxide ("ITO"). Evaporation and sputter deposition are commonly used methods to deposit metals. Electrodes 30 provide the electrical contact between grasping elements 10, 15 and 20, and their respective voltage sources.

A subsequent patterning and deposition process can be used to create a catalytic deposit (not shown) atop electrodes 30. Again, the same patterning and deposition processes are applicable to the production of the catalytic deposit. Catalytic materials include, but are not limited to, iron, cobalt, nickel, and their oxides and alloys. Additives to the catalyst are known, and these include yttrium, molybdenum, magnesium, calcium and titanium, and their oxides and alloys. These catalytic deposits can be produced advantageously by electron beam lithography, as this method is suited to produce small features. These catalyst materials are known to catalyze the synthesis of carbon nanotubes, which grow attached to the electrode at one end, and extend into the free space above the electrode at the other. These carbon nanotubes form the grasping elements 10, 15 and 20. If the catalytic deposit is small, between about 20 and 150 nm in diameter, a single nanotube with an outer diameter nearly matching the deposit can be grown. For deposits larger than about 150 nm in diameter, multiple nanotubes are frequently nucleated. However, variations in CVD growth conditions can alter this transition point. The thickness of the catalytic deposit can also be varied, and impacts the morphology of the nanotube.

The synthesis of the carbon nanotube elements from the catalytic deposits requires the introduction of the sample to a chemical vapor deposition (CVD) system. Many different processes are known in the art to create aligned nanotube growth, each with its own advantages and drawbacks.

One set of conditions that is well suited to this fabrication occurs in an environment where the temperature, pressure, gas composition and electric field are controlled. It is advantageous to control the temperature to between about 400 and about 900 degrees C., most favorably to near 700 degrees C.; the pressure to between about 0.1 and about 50 Torr, more favorably to about 1 to about 20 Torr; and the DC applied electric field strength to between about 200 volts per centimeter (V/cm) and about 500 V/cm, preferably near 300 V/cm. The composition of the gas flowed through the CVD chamber is between about 5% and about 50% acetylene, ethylene, methane, toluene or other carbon containing gas, with the balance being ammonia, nitrogen, hydrogen, or other non-carbon bearing gas. A preferred gas composition is achieved with about a 4:1 flow rate ratio between ammonia and the acetylene, using nickel catalyst deposits on a silicon wafer with chromium electrode contacts. These conditions favor nanotube nucleation and growth, and are maintained until the nanotubes have grown to the desired length. Typical process times do not exceed about one hour at these conditions. Nanotubes can be grown from about 20 to about 150 nm in diameter, and up to about 40 microns in length under these conditions. Smaller nanotubes are produced by smaller diameter catalytic deposits of other metals and can be more favorably grown at other conditions, as is well known in the art.

As the nanotube's aspect ratio (i.e., height to diameter) increases above about 1000:1, there is decreased alignment as the tips begin to flop over. Therefore, there is a maximum length for the nanotube to be grown to retain its structural rigidity. In practice, it has been found that about 20 microns is a practical length for the favored embodiment. Additionally, it has been found that the nanotube tip morphology can be changed. Round, flat and pointed tips are created by variations in process conditions. After growth, the catalytic deposits will have nucleated and grown aligned carbon nanotube elements 10, 15 and 20 atop electrodes 30, resulting in the grasping device shown in FIG. 1A or in another, similar device as defined by the lithographic patterning of the electrode and catalyst.

Electrical stimuli (such as electrostatic charges) can be applied to nanotubes, if the nanotubes are conductive. The electrical conductivity of carbon nanotubes has been measured, and found to be dependent upon the individual nanotube geometry. Carbon nanotubes are often conductive, with a resistivity of approximately $10^{-4}$ ohm cm. See, for example, A. Thess et al., "CRYSTALLINE ROPES OF METALLIC CARBON NANOTUBES", Science, 273, 483-487 (Jul. 26, 1996).

Still referring to FIG. 1A, nanoscale grasping device 5 is positioned above an object 35 on a surface 40. Now referring to FIG. 1B, a voltage V1 is applied to grasping element 10 through the corresponding electrode. Voltages V2 and V3 are applied to the other electrodes, respectively, whereby they will be applied to grasping elements 15 and 20, respectively. When the applied voltages cause electrostatic attraction, the tips of grasping elements 10, 15 and 20 approach one another, thereby trapping object 35 between the tips, as portrayed in FIG. 1B. Application of further voltage may bend or compress the object within the grasping device. Upon removal of the voltages, the tips may stay closed, if Van der Waals forces are sufficient to overcome the restoring force of the strained grasping elements. In this case, the application of the same voltage to all three grasping elements will cause electrostatic repulsion, and open the closed grasping device, thereby releasing the object. If the Van der Waals forces are weak compared to the restoring force of the elements, the grasping tool will open spontaneously upon removal of the voltages, releasing the object. The application of the voltages V1, V2 and V3 can be provided directly by a phased power supply (not shown) or switched by a CPU to apply complex waveforms to the elements.

Significantly, by forming the nanoscale grasping device with at least three elements, which together define a plane, the target object may be grasped more accurately, more easily held in a defined location or orientation, and more readily manipulated.

Figure 2:
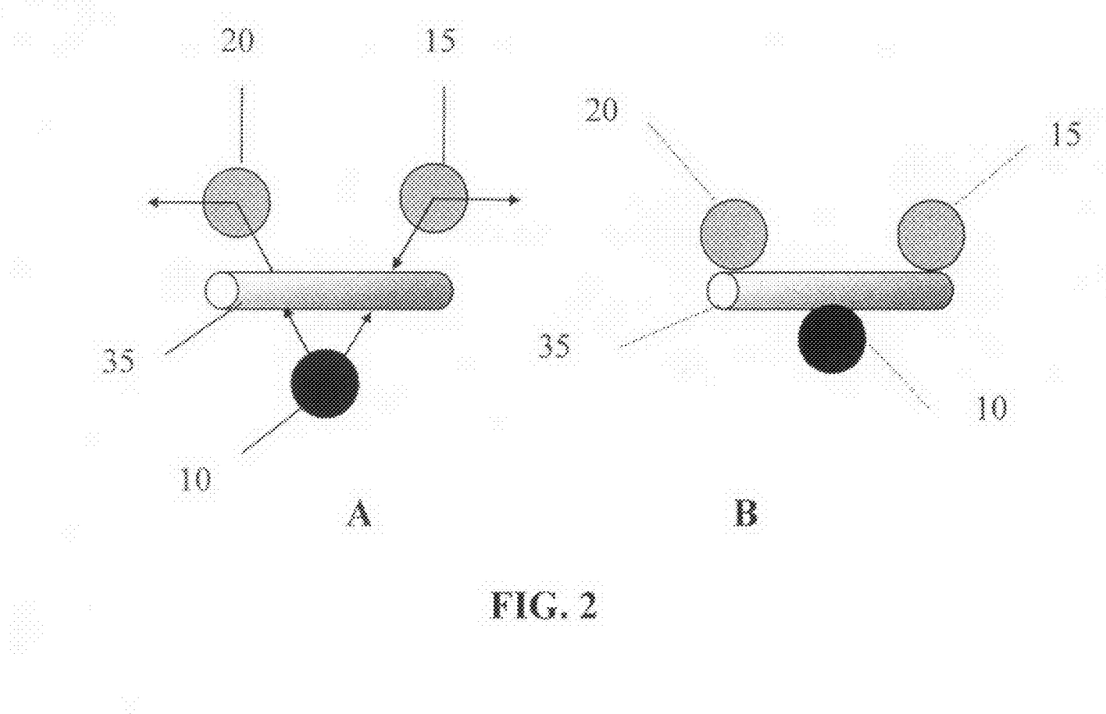
FIG. 2A a schematic representation of the forces exerted on a three element nanoscale grasping device when a static voltage, either positive (+), negative (−), positive (+) or otherwise, is applied to the grasping device. An object in the center will be grasped by the device.
FIG. 2B is a schematic representation of the relative positions of the grasping elements after the voltage has been applied. It should be noted that this grasping mechanism is well suited to grasping oblong or irregular shaped objects.

Referring next to FIGS. 2A and 2B, the grasping of a particle can be accomplished using a static applied voltage. Grasping element 10 is charged to voltage V1. Grasping elements 15 and 20 are charged to voltages V2 and V3, respectively, which are both equal and opposite to V1. Object 35, located between the three grasping elements, is grasped due to the electrostatic attraction between grasping elements 10 and 15 and between grasping elements 10 and 20. The repulsion between elements 15 and 20 widens the span of the grasping area.

Figure 3:
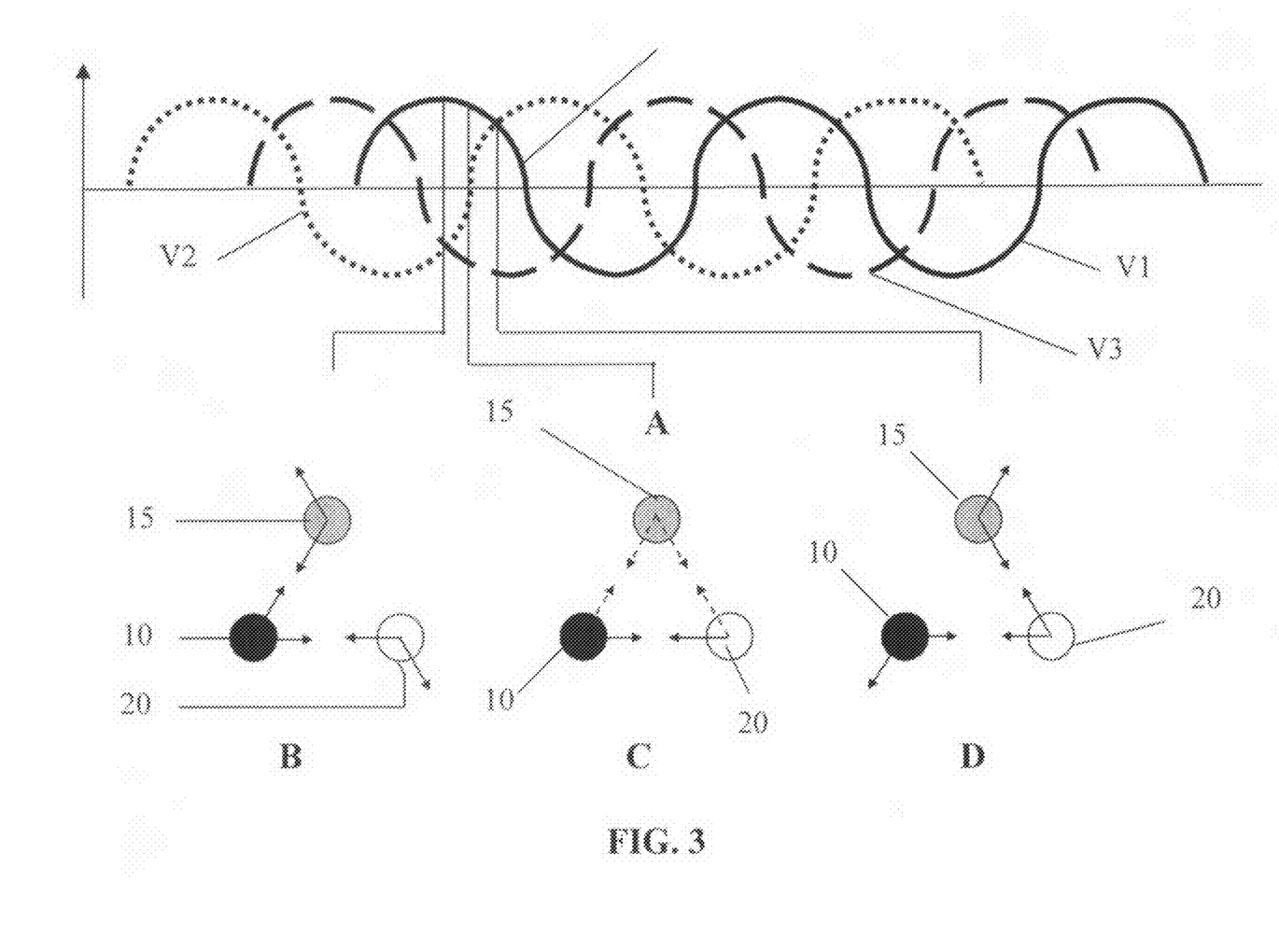
FIG. 3 consists of a set of four schematic representations (FIGS. 3A, 3B, 3C and 3D) of an oscillating voltage applied to the grasping elements and the electrostatic forces created between the grasping elements at different points in the cycle. When the time average forces are calculated, the net effect is an attractive force between the three grasping elements. If the phase rotation speed is slow, the individual motions of the grasping elements may be observed, but as the phase rotation speed is increased, the time average phenomenon dominates the overall effect.

Referring next to FIG. 3A, the voltages V1, V2 and V3 may vary in a periodic fashion with time. Periodically varying potentials may include, for example, sinusoidal, squarewave and sawtooth waveforms, and may be biased above zero voltage. For convenience, a sinusoidal waveform with a constant baseline amplitude is shown in FIG. 3A. The phase of the potential on each grasping element lags in this example by 120 degrees. FIGS. 3B, 3C and 3D are representations of the forces created by the application of the oscillating voltages on the elements, as seen looking down upon grasping elements 10, 15 and 20. At different points in the cycle, each element undergoes a time varying attraction or repulsion to the other elements. At the portions of the cycle indicated by FIGS. 3B and 3D, there is an effect equivalent to the steady state case, shown in FIG. 2A. Forces are indicated by arrows. At the intermediate point portrayed in FIG. 3C, the grasping element at zero potential becomes polarized, and the effect is a strong compressive force between the two charged grasping elements, and a weaker compressive force (indicated by dashed arrows) between the polarized element and the charged elements. When the time average forces are considered, there is an overall attractive force between the three elements.

Figure 4:
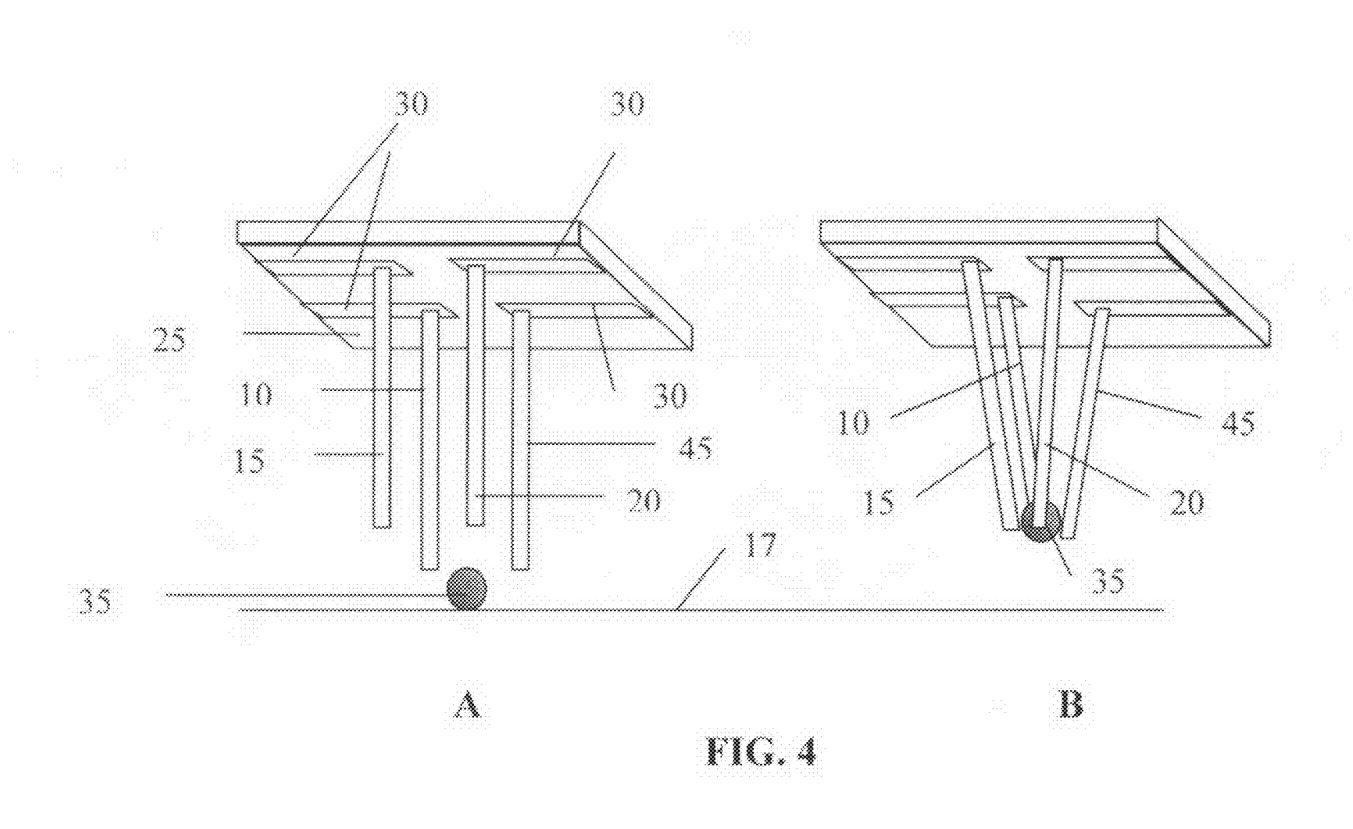
FIG. 4A is a schematic representation of a nanoscale grasping device comprising four grasping elements 10, 15, 20 and 45, fabricated on a substrate 25, with electrodes 30 for voltage application. An object 35 sits below the grasping device on a surface 40.
FIG. 4B is a schematic representation of the same nanoscale grasping device holding the object 35 after a voltage has been applied to grasping elements 10, 15, 20 and 45, causing them to close around the object.

FIGS. 4A and 4B are, like FIGS. 1A and 1B, both schematic representations of a multiple element grasping device, fabricated on a substrate with electrodes for voltage application. In FIGS. 4A and 4B, the grasping has been constructed with four grasping elements. After a voltage has been applied to the grasping elements, the elements grasp the object as shown in FIG. 4B.

Figure 5:
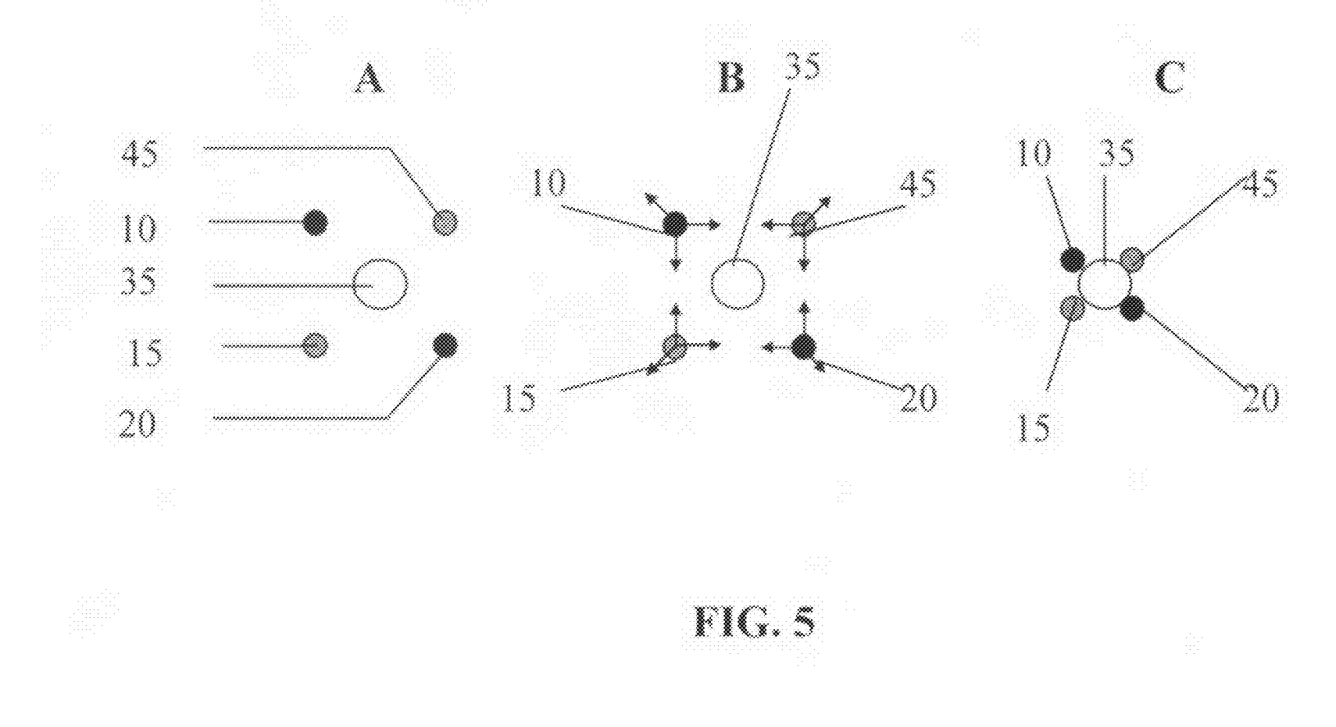
FIG. 5A is a schematic representation of the grasping elements 10, 15, 20 and 45 before any voltage is applied. An object 35 is located between the elements.
FIG. 5B is a schematic representation of the same nanoscale grasping device after a steady state voltage is applied to the electrodes. In this figure, grasping elements 10 and 20 share the same voltage, which is opposite to the voltage applied to grasping elements 15 and 45. Arrows indicate the resulting electrostatic attractive and repulsive forces. The weaker diagonal repulsive forces will be overcome by the orthogonal attractive forces, resulting in a net attractive force.
FIG. 5C is a schematic representation of the same nanoscale grasping device after the voltage has been applied and the effects of the electrostatic attraction have caused the grasping elements to come together, resulting in a compressive force on the object 35 between the elements.

This tool has some distinct features that should be noted. FIG. 5A shows the rest positions of the four grasping elements 10, 15, 20 and 45 surrounding an object 35. A steady state voltage is applied to elements 15 and 45, and an opposing voltage is applied to elements 10 and 20. The voltage induces electrostatic attractive and repulsive forces at the tips, which are portrayed in FIG. 5B. Weaker diagonal repulsive forces will be overcome by the orthogonal attractive forces, resulting a net attractive force, thereby grasping object 35 between the grasping elements, as shown in FIG. 5C. The four element array can be actuated in either a corner-to-corner mode or a side-to-side pattern, with different resulting grasping action.

Figure 6:
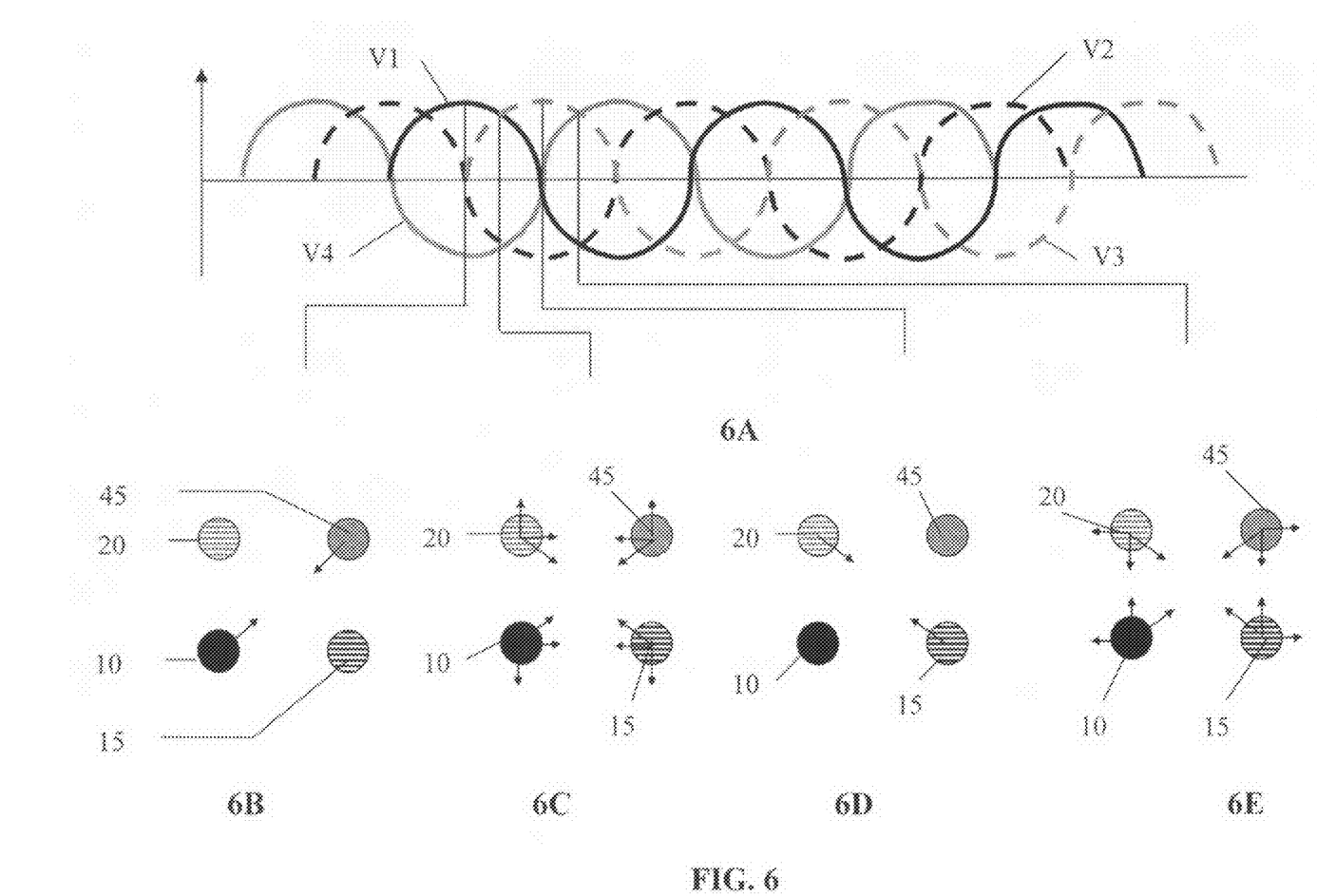
FIG. 6A represents an oscillating voltage applied to a four element array and the forces created between the grasping elements at different points in the cycle. When the time average forces are calculated, the net effect is an attractive force between the grasping elements. Again, if the phase rotation speed is slow, the individual motions of the elements may be observed, but as the phase rotation speed is increased, the time average phenomenon dominates the overall effect.
FIG. 6B is a schematic representation of the four grasping elements at one point in the voltage cycle, where grasping element 10 is at its maximum positive voltage V1, grasping element 45 is at its maximum negative potential V4, and therefore an attractive force exists between grasping elements 10 and 45. Grasping elements 15 (V2) and 20 (V3) are at zero potential, but to the extent that they will polarize, there may be an attractive force between all of the elements. Arrows indicate the attractive force between grasping elements 10 and 45.
FIG. 6C is a schematic representation of the grasping four elements at a later point in the voltage cycle; here, grasping elements 10 and 20 are at the same positive voltage, while grasping elements 15 and 45 are at the same negative voltage. An attractive force exists between grasping elements 10 and 45, and between grasping elements 10 and 15, and between grasping elements 20 and 45, and between grasping elements 15 and 20; while a repulsive force is felt between grasping elements 10 and 20, and between grasping elements 15 and 45. Arrows indicate the attractive and repulsive forces. The net result is compression of the tips towards each other.
FIG. 6D is a schematic representation of the four grasping elements at a later point in the voltage cycle; here, grasping elements 10 and 45 are at zero voltage, while grasping elements 15 and 20 have reached opposite maximum voltages. An attractive force exists between grasping elements 15 and 20, and the overall effect is equivalent to that of FIG. 6B.
FIG. 6E is a schematic representation of the grasping four elements at a later point in the voltage cycle; here, grasping elements 10 and 15 are at the same negative voltage, while grasping elements 20 and 45 are at the same positive voltage. An attractive force exists between grasping elements 10 and 45, and between grasping elements 10 and 20, and between grasping elements 15 and 20, and between grasping elements 15 and 45; while a repulsive force is felt between grasping elements 20 and 45, and between grasping elements 10 and 15. Arrows indicate the attractive and repulsive forces. The net result is compression of the tips towards each other.

Alternatively, the four grasping elements may be driven by oscillating potentials, in the manner described about for the three element grasping device. For the four element device, FIG. 6A schematically represents the oscillating voltage. FIGS. 6B, 6C, 6D and 6E represent the element tics and the forces created between them at different points in the cycle. Again, when the time average forces are calculated, the net is an attractive force between the grasping elements.

It is also important to note that the electrical properties of the object between the elements can be measured using the four point tool. It may be advantageous to make the measurements at the point of zero voltage in one pair of electrodes.

The voltage required to actuate the elements is a function of nanotube stiffness, which is in turn a function of nanotube length and diameter. The voltage required to bring the elements together is also a function of the contact area, or size of the nanotube.

The objects that can be grasped depend upon the spacing between the nanotubes. An object somewhat larger can be accommodated by applying a common potential to all of the grasping elements, which will drive them apart.

The ability to control the voltage applied to the tips allows the gripping strength to be altered. The gripping strength will depend upon the voltage-induced strain in the nanotubes. If a sufficiently high voltage was applied to the grasping elements, the object may be strained or sheared into pieces.

The multiple element grasping device can also be used as a standard AFM tip, to locate objects on a surface, either when closed, thereby forming a single tip, or when open, thereby forming a multi-tip AFM.

Alternative Embodiments

The oscillating voltages may be applied in a manner such that a torque is placed on the object within the gripping elements. This may be used to rotate the object.

It should also be appreciated that a field of such elements could be addressed in a transverse wave pattern to produce a repeating pattern of waves across the surface. Such motion could impart surface motion capabilities, or serve as a form of micro-locomotion.

What is claimed is:

1. A nanoscale grasping device for the manipulation of microscopic objects, comprising at least three electrostatically actuated grasping elements;
   wherein each of said at least three grasping elements is independently supplied with a voltage sufficient to induce electrostatic forces between at least two of said grasping elements, whereby to close or open said grasping elements; and
   wherein an oscillating voltage is applied to at least one of said grasping elements.

2. The nanoscale grasping device of claim 1 wherein said at least three grasping elements comprise a fibrous material.

3. The nanoscale grasping device of claim 2 wherein at least one of said grasping elements comprises a carbon nanotube.

4. The nanoscale grasping device of claim 3 wherein said carbon nanotube is grown by a chemical vapor deposition (CVD) technique.

5. The nanoscale grasping device of claim 2 wherein at least one of said grasping elements is chemically functionalized to bind specific molecules to said grasping element.

6. The nanoscale grasping device of claim 2 wherein at least one of said grasping elements is chemically functionalized to bind particles to said grasping element.

7. The nanoscale grasping device of claim 1 wherein the oscillating voltage applied to at least one of said grasping elements is in phase with the oscillating voltage applied to at least one of the remaining grasping elements.

8. The nanoscale grasping device of claim 1 wherein the oscillating voltage applied to at least one of said grasping elements is substantially out of phase with the oscillating voltage applied to at least one of the remaining grasping elements.

9. A nanoscale grasping device for the manipulation of microscopic objects, comprising at least three electrostatically actuated grasping elements;
   wherein resonant vibration in said grasping elements is cancelled by oscillating voltages applied to said grasping elements.

10. The nanoscale grasping device of claim 9 wherein said resonant vibration is thermally induced.

11. The nanoscale grasping device of claim 9 wherein said resonant vibration is mechanically induced.

12. A nanoscale grasping device for the manipulation of microscopic objects, comprising at least three electrostatically actuated grasping elements;
   wherein oscillating voltages are applied to said grasping elements in order to enhance resonant vibration in said grasping elements.

13. A nanoscale grasping device for the manipulation of microscopic objects, comprising at least three electrostatically actuated grasping elements;
   wherein said grasping device comprises three grasping elements, and further wherein a steady state voltage is applied to two of said grasping elements while the remaining grasping element is left at a fixed voltage so as to induce electrostatic forces between said grasping elements, whereby to open or close said grasping elements; and
   wherein said fixed voltage is ground.

14. A nanoscale grasping device for the manipulation of microscopic objects, comprising at least three electrostatically actuated grasping elements;
   wherein said grasping device comprises three grasping elements, and further wherein an oscillating voltage is applied to each of said three grasping elements, with the phases of the oscillating voltages being substantially different on all three grasping elements, thereby inducing electrostatic forces between said grasping elements.

15. The nanoscale grasping device of claim 14 wherein the oscillating voltage applied to each grasping element is substantially 120 degrees out of phase with its neighboring grasping elements.

16. A nanoscale grasping device for the manipulation of microscopic objects, comprising at least three electrostatically actuated grasping elements;
   wherein said grasping tool comprises four grasping elements, and further wherein a steady state voltage is applied to two neighboring grasping elements, and the remaining two grasping elements are left at another voltage.

17. The nanoscale grasping device of claim 16 wherein said another voltage is ground voltage.

18. A nanoscale grasping device for the manipulation of microscopic objects, comprising at least three electrostatically actuated grasping elements;
   wherein said grasping tool comprises four grasping elements, and further wherein a steady state voltage is applied to two diametrically opposite grasping elements, and the remaining two grasping elements are left at another voltage.

19. The nanoscale grasping device of claim 18 wherein said another voltage is ground voltage.

20. A nanoscale grasping device for the manipulation of microscopic objects, comprising at least three electrostatically actuated grasping elements;
   wherein said grasping tool comprises four grasping elements, and further wherein an oscillating voltages are applied to each of said grasping elements, with each oscillating voltage being substantially 90 degrees out of phase with the other oscillating voltages.

21. A nanoscale grasping device for the manipulation of microscopic objects, comprising at least three electrostatically actuated grasping elements;
   wherein said grasping device comprises n grasping elements, wherein n is greater than 4.

22. The nanoscale grasping device of claim 21 wherein steady state voltages are applied to said grasping elements so as to induce electrostatic forces between said grasping elements.

23. The nanoscale grasping device of claim 21 wherein an n phase oscillating voltage is applied to each grasping element, substantially 360/n degrees out of phase with said other grasping elements.

24. The nanoscale grasping device of claim 21 wherein a steady state voltage is applied to at least one of said grasping elements.

25. A nanoscale grasping device for the manipulation of microscopic objects, comprising at least three electrostatically actuated grasping elements;
   wherein at least one of said grasping elements is adapted for use as a probe in atomic force microscopy and scanning probe microscopy techniques.

26. A nanoscale grasping device for the manipulation of microscopic objects, comprising at least three electrostatically actuated grasping elements;
   wherein at least one of said grasping elements is adapted for use in performing electrical and mechanical analysis of a sample.

* * * * *